(12) United States Patent
Zhu et al.

(10) Patent No.: US 8,492,842 B2
(45) Date of Patent: Jul. 23, 2013

(54) METHOD FOR FORMING RETROGRADED WELL FOR MOSFET

(75) Inventors: Huilong Zhu, Poughkeepsie, NY (US); Zhijiong Luo, Carmel, NY (US); Qingqing Liang, Fishkill, NY (US); Haizhou Yin, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 4 days.

(21) Appl. No.: 13/429,948

(22) Filed: Mar. 26, 2012

(65) Prior Publication Data

US 2012/0187491 A1 Jul. 26, 2012

Related U.S. Application Data

(62) Division of application No. 12/687,287, filed on Jan. 14, 2010.

(51) Int. Cl.
*H01L 27/12* (2006.01)

(52) U.S. Cl.
USPC .............. 257/347; 257/E21.561; 257/E29.02; 438/151

(58) Field of Classification Search
USPC .............. 257/347, E21.561, E29.02; 438/151
See application file for complete search history.

(56) References Cited

U.S. PATENT DOCUMENTS

| | | |
|---|---|---|
| 2002/0056873 A1 | 5/2002 | Wann |
| 2005/0042867 A1 | 2/2005 | Sanchez et al. |
| 2006/0289933 A1 | 12/2006 | Gossner |
| 2007/0232003 A1 | 10/2007 | Loo et al. |
| 2008/0179688 A1 | 7/2008 | Thei et al. |

OTHER PUBLICATIONS

Notice of Allowance dated Aug. 22, 2012.

*Primary Examiner* — Eugene Lee
*Assistant Examiner* — Elias M Ullah
(74) *Attorney, Agent, or Firm* — Scully, Scott, Murphy & Presser, P.C.; H. Daniel Schnurmann (57) ABSTRACT

A method of forming an electrical device is provided that includes forming at least one semiconductor device on a first semiconductor layer of the SOI substrate. A handling structure is formed contacting the at least one semiconductor device and the first semiconductor layer. A second semiconductor layer and at least a portion of the dielectric layer of the SOI substrate are removed to provide a substantially exposed surface of the first semiconductor layer. A retrograded well may be formed by implanting dopant through the substantially exposed surface of the first semiconductor layer into a first thickness of the semiconductor layer that extends from the substantially exposed surface of the semiconductor layer, wherein a remaining thickness of the semiconductor layer is substantially free of the retrograded well dopant. The retrograded well may be laser annealed.

22 Claims, 3 Drawing Sheets

METHOD FOR FORMING RETROGRADED WELL FOR MOSFET

CROSS REFERENCE TO RELATED APPLICATION

This application is a divisional of U.S. patent application Ser. No. 12/687,287, filed Jan. 14, 2010 the entire content and disclosure of which is incorporated herein by reference.

BACKGROUND

The present disclosure relates to the fabrication of a semiconductor device, and in one embodiment to a method of fabricating a metal oxide semiconductor field effect transistor (MOSFET) having a retrograded well.

Over the past twenty-five years or so, the primary challenge of very large scale integration (VLSI) has been the integration of an ever-increasing number of MOSFET devices with high yield and reliability. This was achieved mainly by scaling down MOSFET channel lengths without excessive short-channel effects. Short-channel effects are the decrease in threshold voltage ($V_t$) in short-channel devices due to two-dimensional electrostatic charge sharing between the gate and the source/drain regions.

SUMMARY

A method of forming a retrograded well is provided, in which in some embodiments the retrograded well is formed after front end of the line processing (FEOL), e.g., after formation of the semiconductor device. In one embodiment, the method includes providing a substrate having a dielectric layer present thereon. A semiconductor layer is present on the dielectric layer. At least one semiconductor device is formed on the semiconductor layer, wherein a gate structure of the at least one semiconductor device is present on a second surface of the semiconductor layer that is opposite a first surface of the semiconductor layer that is in contact with the dielectric layer. Source regions and drain regions are formed in contact with portions of the semiconductor layer that are adjacent to a portion of the semiconductor layer that is in contact with the gate structure. A handling structure is formed on the at least one semiconductor device and the second surface of the semiconductor layer. The substrate and at least a portion of the dielectric layer are removed. A retrograded well is implanted through the first surface of the semiconductor layer. A buried dielectric layer is then formed positioned on the first surface of the semiconductor layer and the handling structure is removed.

In another embodiment, the method includes providing a semiconductor on insulator (SOI) substrate including a first semiconductor layer and a second semiconductor layer separated by a dielectric layer, and forming at least one semiconductor device on the first semiconductor layer of the SOI substrate. A handling structure is formed contacting the at least one semiconductor device and the first semiconductor layer. The second semiconductor layer and at least a portion of the dielectric layer of the SOI substrate are removed to provide a substantially exposed surface of the first semiconductor layer. A retrograded well may be formed by implanting at least one dopant through the substantially exposed surface of the first semiconductor layer into a first thickness of the semiconductor layer present extending from the substantially exposed surface of the first semiconductor layer. The remaining thickness of the semiconductor layer is substantially free of the at least one dopant of the retrograded well. A buried dielectric layer is then formed on the exposed surface of the semiconductor layer and the handling structure is removed. The retrograded well may be laser annealed.

In another aspect, a semiconductor device is provided having a retrograded well. In one embodiment, the semiconductor device includes a semiconductor layer overlying a dielectric layer, in which a gate structure is present on the semiconductor layer. Source regions and drain regions are present within the semiconductor layer adjacent to a portion of the semiconductor layer that the gate structure is in contact with. A retrograded well is present between the source regions and the drain regions and extends from the dielectric layer, wherein the retrograded well includes dopant of opposite conductivity than the source and drain regions. The concentration of the dopant of the retrograded well is greater than $1 \times 10^{16}$ atoms/cm$^3$. A region substantially free of the dopant of the retrograded well is present extending from the surface of the semiconductor layer that is in contact with the gate structure, and is present over the retrograded well and between the source regions and the drain regions.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, wherein like reference numerals denote like elements and parts, in which.

DESCRIPTION OF THE PREFERRED EMBODIMENTS

Detailed embodiments of the present invention are disclosed herein; however, it is to be understood that the disclosed embodiments are merely illustrative of the invention that may be embodied in various forms. In addition, each of the examples given in connection with the various embodiments of the invention are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

In some embodiments, methods and structures described herein reduce short channel effects in semiconductor devices, such as metal oxide semiconductor field effect transistors (MOSFETS). In some embodiments, short channel effects are reduced through the incorporation of a retrograded well that is formed through the back side of the semiconductor layer that is housing at least the channel region of a semiconductor device. In one embodiment, the retrograded well is formed after the semiconductor devices have been formed in the semiconductor layer. Therefore, in some examples, the retrograded well may be activated using laser anneal without subjecting the entirety of the semiconductor device to additional thermal anneals. When describing the following structures and methods, the following terms have the following meanings, unless otherwise indicated.

The term "channel" is the region underlying the gate structure and between the source region and drain region of a semiconductor device that becomes conductive when the semiconductor device is turned on.

A "retrograded well" is a region that is underlying the channel of the device and has an opposite conductivity type as the source region and the drain region. The retrograded well extends continuously from the source region to the drain region. In the embodiments, in which the channel is present in a semiconductor layer that is present directly on a dielectric layer, i.e., buried dielectric layer of a substrate, the retrograded well is present within a thickness of the semiconductor layer that extends from the surface of the semiconductor layer that contacts the dielectric layer, which is opposite the surface of the semiconductor layer that is in contact with the gate structure.

As used herein, the term "conductivity type" denotes a dopant region being p-type or n-type.

The term "direct contact" or "directly on" means that a first element, such as a first structure, and a second element, such as a second structure, are connected without any intermediary conducting, insulating or semiconductor layers at the interface of the two elements.

The terms "overlying", "atop", "positioned on" or "positioned atop" mean that a first element, such as a first structure, is present on a second element, such as a second structure, wherein intervening elements, such as an interface structure, e.g., interface layer, may be present between the first element and the second element.

FIGS. 1-6 depict one embodiment of a method for forming an electrical device, in which a retrograded well 50 is formed through the back side of the semiconductor layer 14 that is housing at least the channel region of the semiconductor device 100a, 100b.

Figure 1:
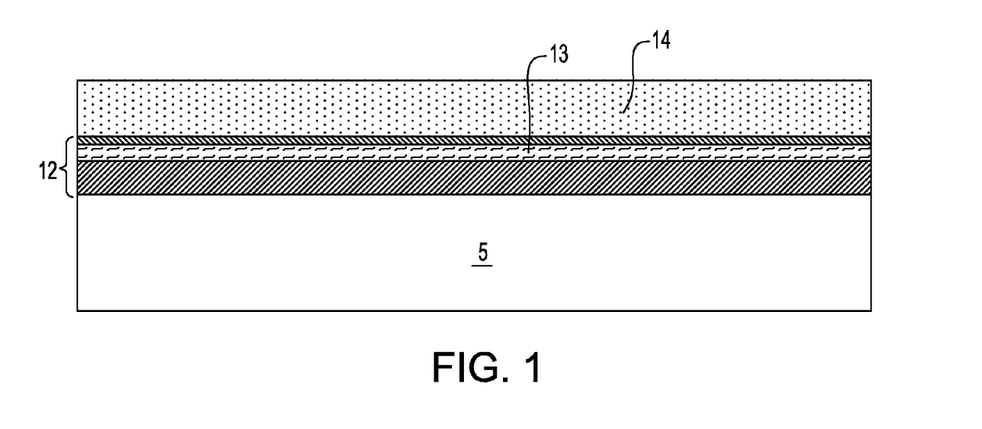
FIG. 1 is a side cross-sectional view depicting providing a substrate having a dielectric layer present thereon, and a semiconductor layer present on the dielectric layer, in accordance with one embodiment of the present method.

FIG. 1 depicts one embodiment of providing a substrate 5 having a dielectric layer 12 present thereon. FIG. 1 also shows a semiconductor layer 14 present on the dielectric layer 12. The substrate 5 may comprise any of several semiconductor materials. Non-limiting examples include silicon, germanium, silicon-germanium alloy, silicon carbide, silicon-germanium carbide alloy and compound (i.e., III-V and II-VI) semiconductor materials. Non-limiting examples of compound semiconductor materials include gallium arsenide, indium arsenide and indium phosphide semiconductor materials. Typically, the substrate 5 has a thickness ranging from 100 nm to $1.5 \times 10^6$ nm.

The dielectric layer 12 may comprise any of several dielectric materials. Non-limiting examples include oxides, nitrides and oxynitrides, particularly of silicon, but oxides, nitrides and oxynitrides of other elements are not excluded. The dielectric layer 12 may comprise a crystalline or a non-crystalline dielectric material. Typically, the dielectric layer 12 comprises an oxide of the semiconductor material from which is comprised the substrate 5. Typically, the dielectric layer 12 has a thickness ranging from 50 nm to about 2000 nm.

The dielectric layer 12 may be deposited or formed on a surface of the substrate 5, or may be formed within the substrate 5. Non-limiting examples include ion implantation methods, thermal or plasma oxidation or nitridation methods, chemical vapor deposition (CVD) methods and physical vapor deposition (PVD) methods. The dielectric layer 12 may also be formed using a wafer bonding or lamination technique.

In some embodiments, the dielectric layer 12 includes a layer of a second dielectric material 13 that is present within the dielectric layer 12. In some examples, the layer of the second dielectric material 13 is formed by ion implantation. In other examples, the layer of the second dielectric material 13 is formed by chemical vapor deposition (CVD). For example, a first portion of dielectric layer 12 may be deposited on the substrate 5 using chemical vapor deposition (CVD), e.g., plasma enhanced chemical vapor deposition (PECVD). Thereafter, the layer of a second dielectric material 13 is may be deposited on the first portion of dielectric layer 13 using chemical vapor deposition (CVD), e.g., plasma enhanced chemical vapor deposition (PECVD). Thereafter, a second portion of dielectric layer 12 may be deposited on the layer of a second dielectric material 13 using chemical vapor deposition (CVD), e.g., plasma enhanced chemical vapor deposition (PECVD). In one embodiment, the layer of the second dielectric material 13 has a thickness of less than 10 nm, and in some examples ranging from 1 nm to 5 nm. In one example, the dielectric layer 12 is composed of an oxide, such as silicon oxide, and the layer of the second dielectric material 13 is composed of a nitride, such as silicon nitride. It is noted that the layer of the second dielectric material 13 is optional, and may be omitted from the present method.

The semiconductor layer 14 that is present on the dielectric layer 12 may comprise any of the several semiconductor materials from which substrate 5 may also be comprised. The semiconductor layer 14 and the substrate 5 may comprise either identical or different semiconductor materials with respect to chemical composition, dopant polarity, dopant concentration and crystallographic orientation. In one embodiment, the semiconductor layer 14 may have a thickness ranging from 2 nm to 100 nm. In another embodiment, the semiconductor layer 14 has a thickness ranging from 5 nm to 20 nm. In one example, the semiconductor layer 14 is composed of a silicon-containing material. Illustrative examples of various silicon-containing materials that can be employed in for the semiconductor layer 14 include, but are not limited to Si, SiGe, SiGeC, SiC and combinations thereof. In another embodiment, the semiconductor layer 14 may also be Ge, Ge alloys, GaAs, InAs, InP as well as other III/V and II/VI compound semiconductors. Combinations of the aforementioned semiconductor materials can also be used. In one embodiment, the semiconductor layer 14 is silicon.

In one embodiment, the structure depicted in FIG. 1 is provided by a semiconductor on insulator (SOI) substrate, in which the semiconductor layer identified by reference number 14 is an SOI layer (also referred to as a first semiconductor layer), the substrate identified by reference number 5 is a base semiconductor layer (also referred to as a second semiconductor layer), and the dielectric layer identified by reference number 12 that is separating the SOI layer from the base semiconductor layer is a buried dielectric layer (also referred to as a buried insulating layer). The components of the SOI substrate may be formed using deposition, thermal growth, ion implantation, or wafer bonding methods.

Figure 2:
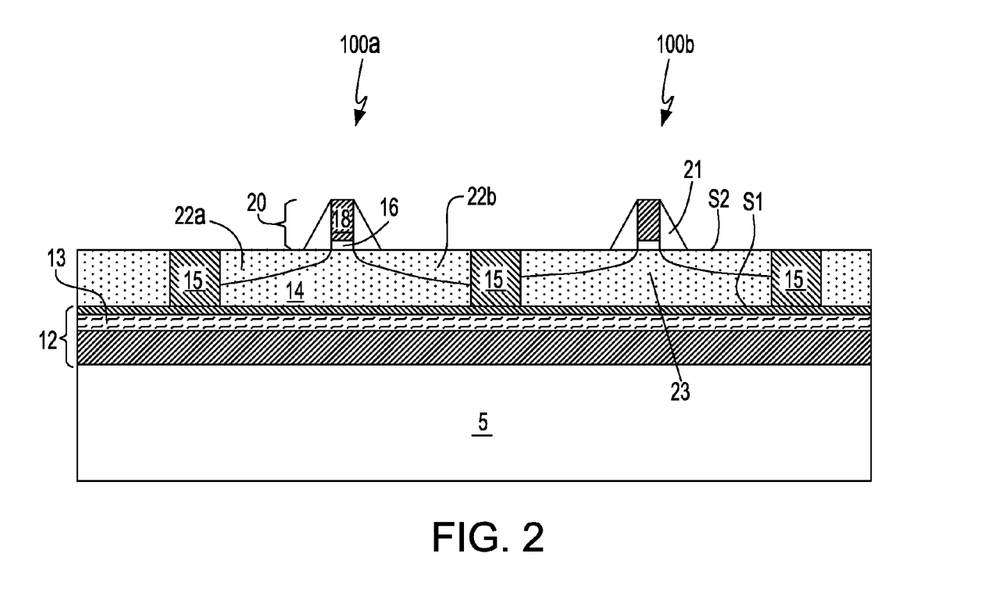
FIG. 2 is a side cross-sectional view depicting forming at least one semiconductor device on the semiconductor layer, wherein a gate structure of one of the at least one semiconductor device is present on a second surface of the semiconductor layer that is opposite a first surface of the semiconductor layer that is in contact with the dielectric layer, and source regions and drain regions are formed in contact with portions of the semiconductor layer that are adjacent to a portion of the semiconductor layer that is in contact with the gate structure, in accordance with one embodiment of the present method.

FIG. 2 depicts one embodiment of the formation of semiconductor devices 100a, 100b consistent with front end of the line (FEOL) semiconductor processing. Specifically, in some embodiments, at least one semiconductor device 100a, 100b is formed on the semiconductor layer 14. In one embodiment, a semiconductor device is an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. In one example, the semiconductor devices 100a, 100b are field effect transistors (FETs). Field effect transistors (FETs) are transistors in which output current, i.e., source-drain current, is controlled by the voltage applied to the gate structure. A field effect transistor typically has three terminals, i.e., gate, source and drain.

Although FIG. 2 only depicts two semiconductor devices 100a, 100b, e.g., a first field effect transistor 100a, and a second field effect transistor 100b, being formed on the semiconductor layer 14, it is noted that a greater number or lesser number of semiconductor devices 100a, 100b can be employed, and are within the scope of the present disclosure. Further, it is noted that the present method is not intended to be limited to structures that only include field effect transistors (FETs), as the semiconductor layer 14 may also include bipolar transistors and may further include memory devices, such as flash memory, dynamic random access memory (DRAM), and embedded dynamic random access memory. It is also noted that the electrical devices incorporated within the semiconductor layer 14 may also include inductors, capacitors, resistors, fuses and/or diodes.

In one embodiment, a first semiconductor device 100a, e.g., first field effect transistor, and a second semiconductor device 100b, e.g., second field effect transistor, may each have the same conductivity. In another embodiment, a first semiconductor device 100a, e.g., first field effect transistor, and a second semiconductor device 100b, e.g., second field effect transistor, may have a different conductivity. For example, in the embodiments, in which the first semiconductor device 100a has a different conductivity than the second semiconductor device 100b, the first semiconductor device 100a may be a p-type field effect transistor, and the second semiconductor device 100b may be an n-type field effect transistor, wherein the first and second semiconductor devices 100a, 100b may be arranged in a complementary metal oxide semiconductor (CMOS) device.

In one embodiment, the first semiconductor device 100a is separated from the second semiconductor device 100b by an isolation region 15 that is formed through the semiconductor layer 14 and contacting the dielectric layer 12. The isolation region 15 may comprise any dielectric material, such as oxide, nitride, oxynitride or a combination thereof. Typically, the isolation region 15 comprises a dielectric isolation material selected from the same group of dielectric isolation materials used for the buried dielectric layer 12. However, a method for fabricating the isolation region 15 may be different from a method used for fabricating the buried dielectric layer 12. For example, and without limitation, an isolation dielectric material from which is comprised the isolation region 15 may be deposited using: rapid thermal processing, for example high-temperature oxide also known as HTO, or plasma deposition, for example high-density plasma oxide also known as HDP oxide, or combinations thereof.

Still referring to FIG. 2, in one embodiment, a gate structure 20 of one of the at least one semiconductor device 100a, 100b is present on a second surface S2 of the semiconductor layer 14 that is opposite a first surface S1 of the semiconductor layer 14 that is in contact with the dielectric layer 12. As used herein, "gate structure" means a structure used to control output current (i.e. flow of carriers in the channel) of a semiconducting device through electrical or magnetic fields. Each of the at least one semiconductor devices 100a, 100b also include source regions 22a and drain regions 22b that are formed in contact with portions of the semiconductor layer 14 that are adjacent to a portion of the semiconductor layer 14 that is in contact with the gate structure 20.

In one embodiment, the semiconductor devices 100a, 100b each include at least one gate dielectric 16 located upon the second surface S2 of the semiconductor layer 14; at least one gate electrode 18 located upon the at least one gate dielectric 16; at least one spacer 21 located adjacent opposite sidewalls of the at least one gate dielectric 16 and the at least one gate electrode 18 (although intended as completely encircling those structures in plan view); and a plurality of extension (not shown), source regions 22a and drain regions 22b located within the semiconductor layer 14. In one embodiment, the source regions 22a and the drain regions 22b are separated by an undoped channel region 23 that is present beneath the gate structures 20.

In one embodiment, the at least one gate dielectric 16 of the gate structure 20 may comprise dielectric materials such as oxides, nitrides and oxynitrides of silicon that have a dielectric constant ranging from 4 (i.e., typically a silicon oxide) to 8, (i.e., typically a silicon nitride) as measured in a vacuum. In another embodiment, the at least one gate dielectric 16 may comprise generally higher dielectric constant dielectric materials having a dielectric constant ranging from 8 to 100. Such higher dielectric constant dielectric materials may include, but are not limited to hafnium oxides, hafnium silicates, zirconium oxides, lanthanum oxides, titanium oxides, barium-strontium-titantates (BSTs) and lead-zirconate-titanates (PZTs). The at least one gate dielectrics 16 may be formed using any of several methods that are appropriate to their material(s) of composition. Non-limiting examples include thermal or plasma oxidation or nitridation methods, chemical vapor deposition (CVD) methods (including atomic layer deposition methods) and physical vapor deposition (PVD) methods. Typically, the at least one gate dielectric 16 is comprised of a thermal silicon oxide dielectric material that has a thickness ranging from 0.5 nm to 7 nm. In another embodiment, the at least one gate dielectric 16 has a thickness ranging from 2 nm to 5 nm.

The at least one gate electrode 18 may comprise materials including but not limited to metals, metal alloys, metal nitrides and metal silicides, as well as combinations and multi-layers thereof. The at least one gate electrode 18 may also comprise doped polysilicon and polysilicon-germanium alloy materials, and polycide materials (doped polysilicon/ metal silicide stack materials). In one embodiment, the at least one gate electrode 18 may be doped polysilicon having a dopant concentration ranging from $1\times10^{18}$ atoms/cm$^3$ to about $1\times10^{22}$ atoms/cm$^3$.

In one embodiment, the at least one gate electrode 18 may be formed using any of several deposition methods. Non-limiting examples include salicide methods, chemical vapor deposition (CVD) methods and physical vapor deposition (PVD) methods, such as, but not limited to evaporative methods and sputtering methods. In one embodiment, the at least one gate electrode 18 comprises a doped polysilicon material that has a thickness ranging from 40 nm to about 200 nm. The at least one gate electrode 18 when comprised of doped polysilicon material may be formed using lithographic and ion implantation methods.

Still referring to FIG. 2, the spacers 21 may be comprised of a dielectric material. In one embodiment, the spacers 21 are comprised of a dielectric having a dielectric constant that is less than 4. In some embodiments, the dielectric of the spacers 21 is selected from oxides, nitrides, oxynitrides, and combinations thereof. The spacer 21 may be formed using methods including but not limited to chemical vapor deposition (CVD) and physical vapor deposition (PVD). In one embodiment, the spacers 21 are formed using a blanket layer deposition and an anisotropic etchback method. In one example, the spacers 21 comprise a combination of silicon oxide and silicon nitride dielectric materials. In one embodiment, formation of the gate structure 20 can include a replacement gate process sequence.

The extension regions (not shown), source regions 22a, and drain regions 22b may be doped with an n-type conductivity dopant or a p-type conductivity dopant. As used herein, the term "drain region" means a doped region in semiconductor device located at the end of the channel, in which carriers are flowing out of the semiconductor device through the drain, and the term "source region" is a doped region in the semiconductor device from which majority carriers are flowing into the channel. "P-type" refers to the addition of impurities to an intrinsic semiconductor that creates deficiencies of valence electrons. In a silicon-containing substrate, examples of n-type dopants, i.e., impurities, include but are not limited to boron, aluminum, gallium and indium. "N-type" refers to the addition of impurities that contributes free electrons to an intrinsic semiconductor. In a silicon containing substrate examples of n-type dopants, i.e., impurities, include but are not limited to antimony, arsenic and phosphorous. In one embodiment, the extension regions, the source regions 22a, and the drain regions 22b are formed using a two step ion implantation method. For example, a first ion implantation process step within the method uses the at least one gate electrode 18 of the gate structure 20, absent the spacers 21, as a mask to form a plurality of extension regions each of which extends beneath the spacers 21. A second ion implantation process step uses the at least one gate electrode 18 of the gate structure 20 and the spacers 21 as a mask to form the larger contact region portions of the extension and the source regions 22a and the drain regions 22b, while simultaneously incorporating the extension regions.

More specifically, when forming p-type extension regions a typical dopant species is boron or $BF_2$. Boron may be implanted utilizing implant energies ranging from 0.2 keV to 3.0 keV with an implant dose ranging from $5\times10^{14}$ atoms/cm$^2$ to $5\times10^{15}$ atoms/cm$^2$. $BF_2$ may be implanted utilizing implant energies ranging from 1.0 keV to 15.0 keV and a dose ranging from $5\times10^{14}$ atoms/cm$^2$ to $5\times10^{15}$ atoms/cm$^2$. A typical implant for the n-type extension regions is arsenic. The n-type extension regions can be implanted with arsenic using implant energies ranging from 1.0 keV to 10.0 keV with a dose ranging from $5\times10^{14}$ atoms/cm$^2$ to $5\times10^{15}$ atoms/cm$^2$.

The source region 22a and the drain region 22b may be implanted by ion implantation. Typical implant species for the n-type source region 22a and the drain region 22b may be phosphorus or arsenic. The n-type dopant for the source region 22a and the drain region 22b may be phosphorus implanted using an energy ranging from 3.0 keV to 15.0 keV with a dose ranging from $1\times10^{15}$ atoms/cm$^2$ to $7\times10^{15}$ atoms/cm$^2$. The n-type dopant for the source region 22a and the drain region 22b may also be arsenic implanted using an energy ranging from 6.0 keV to 30.0 keV with a dose ranging from $1\times10^{15}$ atoms/cm$^2$ to $7\times10^{15}$ atoms/cm$^2$. Typical implant species for the p-type source region 22a and p-type drain region 22b may include boron or $BF_2$. The p-type dopant for the source region 22a and the drain region 22b can also be boron implanted utilizing an energy ranging from 1.0 keV to 8.0 keV with a dose ranging from $1\times10^{15}$ atoms/cm$^2$ to $7\times10^{15}$ atoms/cm$^2$. The p-type dopant for the source region 22a and the drain region 22b may also be $BF_2$ implanted with an energy ranging from 5.0 keV to 40.0 keV and a dose ranging from $1\times10^{15}$ atoms/cm$^2$ to $7\times10^{15}$ atoms/cm$^2$. It is noted that the source region 22a and the drain region 22b may include raised portions that are formed atop the semiconductor layer 14. The raised portions may be composed of epitaxially grown semiconductor material. The raised portions of the source region 22a and the drain region 22b may be doped by an in-situ dopant process during epitaxial growth and/or may be doped by ion implantation.

In the embodiments in which the first semiconductor device 100a and the second semiconductor device 100b are doped to provide devices of opposite conductivity in a complementary metal oxide semiconductor (CMOS) device configuration, selective ion implantation may be provided using ion implantation masks, such as an ion implantation mask composed of photoresist material. More specifically, in one example, a first block mask (not shown) may be formed overlying the portion of the substrate in which the first semiconductor devices 100a are present. The exposed portion of the substrate that includes the second semiconductor device 100b is not protected by the first block mask, and is ion implanted to provide n-type semiconductor devices, while the first semiconductor devices 100a are protected by the first block mask. Thereafter, the first block mask is removed, and a second block mask (not shown) may be formed overlying the portion of the substrate in which the second semiconductor devices 100b are present. The exposed portion of the substrate that includes the first semiconductor device 100a is not protected by the second block mask, and is ion implanted to provide p-type semiconductor devices, while the second semiconductor devices 100b are protected by the second block mask.

The block masks may comprise soft and/or hardmask materials and can be formed using deposition, photolithography and etching. In one embodiment, the block mask comprises a photoresist. A photoresist block mask can be produced by applying a photoresist layer, exposing the photoresist layer to a pattern of radiation, and then developing the pattern into the photoresist layer utilizing conventional resist developer. Typically, the block masks have a thickness ranging from 100 nm to 300 nm.

Still referring to FIG. 2, following implantation of the source regions 22a and the drain regions 22b, the dopant for the source regions 22a and the drain regions 22b may be activated by a thermal anneal. For example, the dopant of the source regions 22a and the drain regions 22b may be activated by an annealing process including but not limited to rapid thermal anneal. In one embodiment, the rapid thermal annealing temperature is carried out using a temperature ranging from 750° C. to 1200° C. for a time period ranging from 1.0 second to 20.0 seconds.

The source regions 22a and the drain regions 22b may in some embodiments include metal semiconductor alloy contact regions, e.g., silicides, at an upper surface of the source regions 22a and drain regions 22b. In some embodiments, the thermal anneal that activates the dopant of the source regions 22a and the drain regions 22b, reacts a deposited metal on an underlying semiconductor layer to provide the metal semiconductor layer, e.g., silicide.

Figure 3:
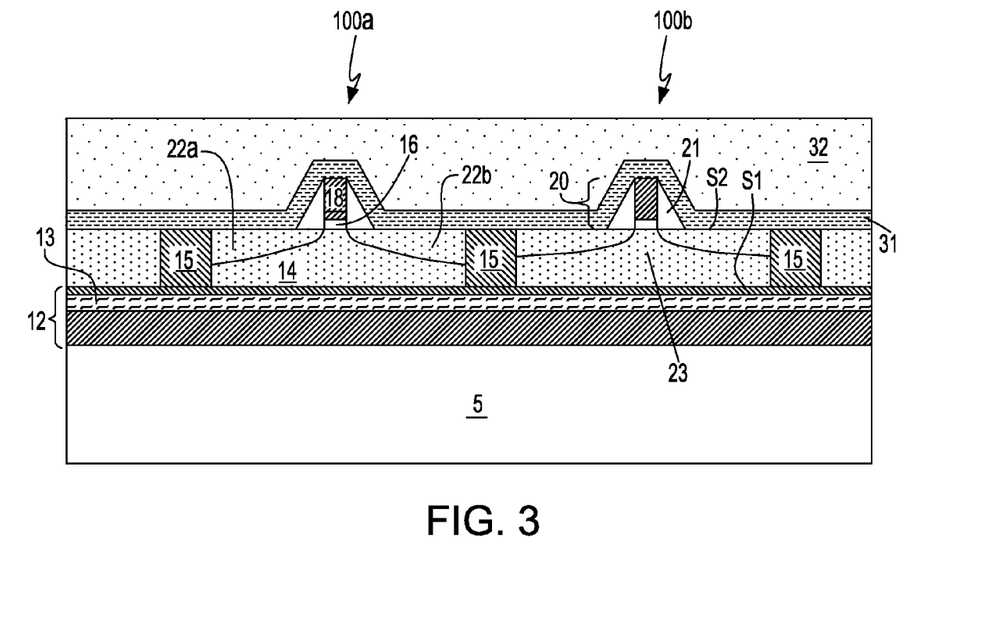
FIG. 3 is a side cross-sectional view depicting forming at least a portion of a handling structure on the at least one semiconductor device and the second surface of the semiconductor layer, in accordance with one embodiment of the present method.
Figure 4:
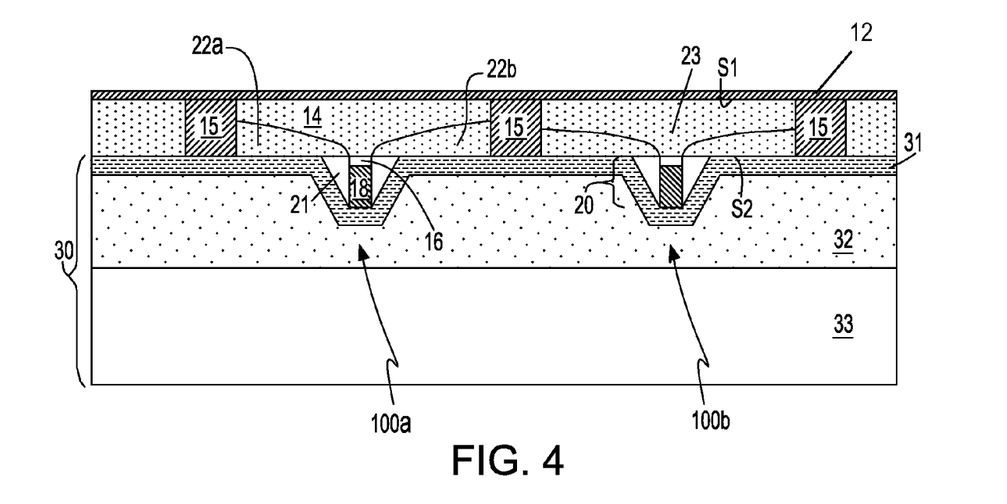
FIG. 4 is a side cross-sectional view depicting removing the substrate and at least a portion of the dielectric layer to substantially expose the first surface of the semiconductor layer, in accordance with one embodiment of the present method.

FIGS. 3 and 4 depict forming a handling structure 30 on the at least one semiconductor device 100a, 100b and the second surface S2 of the semiconductor layer 14. In one embodiment, forming the handling structure 30 on the at least one semiconductor device 100a, 100b and the second surface S2 of the semiconductor layer 14 comprises depositing a conformal dielectric layer 31 on the at least one semiconductor device 100a, 100b and the second surface S2 of the semiconductor layer 14, and depositing a handling semiconductor material 32 on the conformal dielectric layer 31, as depicted in FIG. 3.

The conformal dielectric layer 31 may be composed of any dielectric material including, but not limited to an oxide, a nitride, and/or an oxynitride material. The conformal dielectric layer 31 may be formed by a deposition method, such as chemical vapor deposition (CVD). "Chemical Vapor Deposition" is a deposition process in which a deposited species is formed as a result of a chemical reaction between gaseous reactants at greater than room temperature, wherein a solid product of the reaction is deposited on the surface on which a film, coating, or layer of the solid product is to be formed. Variations of chemical vapor deposition (CVD) processes that are suitable for depositing the conformal dielectric layer 31 include, but are not limited to Atmospheric Pressure CVD (APCVD), Low Pressure CVD (LPCVD), Plasma Enhanced CVD (EPCVD), Metal-Organic CVD (MOCVD), and combinations thereof. Other examples for depositing a conformal dielectric layer 31 include atomic layer deposition (ALD), evaporation, reactive sputtering, chemical solution deposition and other like deposition processes. In one example, the conformal dielectric layer 31 has a thickness ranging from 1 nm to 40 nm. In another example, the conformal dielectric layer 31 has a thickness ranging from 5 nm to 30 nm. In yet another example, the conformal dielectric layer 31 has a thickness ranging from 10 nm to 20 nm. In one embodiment, the conformal dielectric layer 31 is an oxide, such as silicon oxide. In another embodiment, the conformal dielectric layer 31 is a nitride, such as silicon nitride.

The handling semiconductor material 32 may be any semiconductor material. In one embodiment, the handling semiconductor material 32 is composed of a silicon (Si)-containing material. The term "Si-containing layer" as used herein denotes any semiconductor material that includes silicon. Illustrative examples of various Si semiconductor materials that can be employed in the present invention include, but are not limited to Si, SiGe, SiGeC, SiC and other like Si-containing materials. The handling semiconductor material 32 may also be Ge, Ge alloys, GaAs, InAs, InP as well as other III/V and II/VI compound semiconductors. Combinations of the aforementioned semiconductor materials can also be used. In one embodiment, the handling semiconductor material 32 is silicon germanium.

The handling semiconductor material 32 may be formed on the conformal dielectric layer 31 using a deposition method, such as chemical vapor deposition (CVD) or physical vapor deposition (PVD). Variations of CVD processes suitable for forming the handling semiconductor material 32 include, but are not limited to Atmospheric Pressure CVD (APCVD), Low Pressure CVD (LPCVD), Plasma Enhanced CVD (EPCVD), Metal-Organic CVD (MOCVD), and combinations thereof. In one embodiment, the handling semiconductor material 32 may have a thickness ranging from 5 nm to 150 nm. In another embodiment, the handling semiconductor material 32 may have a thickness ranging from 50 nm to 100 nm. In an even further embodiment, the handling semiconductor material 32 may have a thickness ranging from 75 nm to 85 nm.

In one embodiment, an upper surface of the handling semiconductor material 32 may be planarized to provide a planar bonding surface for bonding to a handling wafer 33. Planarization is a material removal process that employs at least mechanical forces, such as frictional media, to produce a planar surface. One example of planarization suitable for planarizing the upper surface of the handling semiconductor material 32 is chemical mechanical planarization (CMP). Chemical mechanical planarization (CMP) is a material removal process using both chemical reactions and mechanical forces to remove material and planarize a surface.

FIG. 4 depicts bonding the planarized upper surface of the handling semiconductor material 32 to the handling wafer 33. The handling wafer 33 may be composed of materials typical of semiconductor manufacturing, which include, but are not limited to Si-containing materials, GaAs, InAs and other like semiconductors. Si-containing materials as used to provide the handling wafer 33 include, but are not limited to Si, bulk Si, single crystal Si, polycrystalline Si, SiGe, amorphous Si, silicon-on-insulator substrates (SOI), SiGe-on-insulator (SGOI), strained-silicon-on-insulator, annealed poly Si, and poly Si line structures. In some embodiments, the handling wafer 33 may be composed of a dielectric, such as an oxide material, nitride material, oxynitride material or combination thereof.

In one embodiment, the handling semiconductor material 32 is bonded to the handling wafer 33 using adhesive bonding or thermal bonding. Examples of adhesives suitable for bonding the handling semiconductor material 32 to the handling wafer 33 include solder, wax and polymer adhesives. In the embodiments utilizing thermal bonding methods, the handling semiconductor material 32 is thermally bonded to the handling wafer 33 by contacting a planar surface of the handling wafer 33 to a planar surface of the handling semiconductor material 32 under increased temperature and an optional application of pressure. In one example, the temperature of the thermal bonding method may range from 100° C. to 400° C.

FIG. 4 further depicts one embodiment of removing the substrate 5 and at least a portion of the dielectric layer 12. In one embodiment, the dielectric layer 12 is removed to expose the first surface S1 of the semiconductor layer 14. In one embodiment, removing the substrate 5 and the dielectric layer 12 to substantially expose the first surface S1 of the semiconductor layer 14 comprises planarization or a selective etch process. By "substantially exposed" it is meant that a remaining portion of the dielectric layer 12 when present on the semiconductor layer 14 is of a thickness that allows for ion implantation of dopants for the subsequently formed retrograded well to be implanted through the remaining portion of the dielectric layer 12 into the semiconductor layer 14.

In one embodiment, the substrate 5 is removed by planarization, such as chemical mechanical planarization or grinding, which may be accompanied by separation by ion implantation. In another embodiment, the substrate 5 may be removed by a selective etch process that removes the substrate 5 selective to the dielectric layer 12. As used herein, the term "selective" in reference to a material removal process denotes that the rate of material removal for a first material is greater than the rate of removal for at least another material of the structure to which the material removal process is being applied. In one example, the etch chemistry that removes the substrate 5 is selective to the dielectric layer 12. In some examples, the etch process is an anisotropic etch. As used herein, the term "anisotropic etch process" denotes a material removal process in which the etch rate in the direction normal to the surface to be etched is much higher than in the direction parallel to the surface to be etched. One example of an anisotropic etch process is reactive ion etching (RIE). Reactive ion etch (RIE) is a form of plasma etching, in which the surface to be etched is placed on the RF powered electrode and takes on a potential that accelerates an etching species, which is extracted from a plasma, towards the surface to be etched, wherein a chemical etching reaction takes place in the direction normal to the surface being etched. Alternatively, the anisotropic etch process may be provided by laser ablation.

In one embodiment, following removal of the substrate 5, the dielectric layer 12 may be etched so that a remaining thickness of the dielectric layer 12 is present on the first surface Si of the semiconductor layer 14. The remaining thickness of the dielectric layer 12 that is present on the first surface S1 of the semiconductor layer 14 may range from 1 nm to 20 nm. In another embodiment, the remaining thickness of the dielectric layer 12 that is present on the semiconductor layer 14 ranges from 1 nm to 10 nm. In another embodiment, the remaining thickness of the dielectric layer 12 that is present on the semiconductor layer 14 ranges from 2 nm to 5 nm. It is noted that other thicknesses for the remaining portion of the dielectric layer 12 have been contemplated and are within the scope of the present disclosure, so long as the thickness for the remaining portion of the dielectric layer 12 allows for implantation of dopants for the retrograded well through the remaining portion of the dielectric layer 12 into the semiconductor layer 14.

When removing the substrate 5 and the dielectric layer 12 using selective etching, the etch chemistry for etching the substrate 5 may be different than the etch chemistry for etching the dielectric layer 12. In another example, the substrate 5 and the dielectric layer 12 may be etched by the same etch chemistry. In one embodiment, the layer of a second dielectric material 13 that is present within the dielectric layer 12 functions as an etch stop facilitate etching of the dielectric layer 12 so that remaining portion of the dielectric layer 12 is present on the first surface Si of the semiconductor layer 14. For example, in the embodiments in which the layer of a second dielectric material 13 is present within the dielectric layer 12, in a first selective etch step, the dielectric layer 12 may be etched selective to the second dielectric material 13. Thereafter, the layer of the second dielectric material 13 is etched selective to the remaining portion of the dielectric layer 12 that is present between the layer of the second dielectric material 13 and the first surface S1 of the semiconductor layer 14. In another embodiment, in which the layer of the second dielectric material 13 may be omitted, the dielectric layer 12 may be etched using a timed etch that is terminated once the desired thickness of the remaining portion of the dielectric layer 12 has been provided on the first surface S1 of the semiconductor layer 14. In yet another embodiment, the dielectric layer 12 may be removed in it's entirety to expose the first surface S1 of the semiconductor layer 14 using an etch process that employs an etch chemistry for removing the dielectric layer 12 selective to the semiconductor layer 14.

Figure 5:
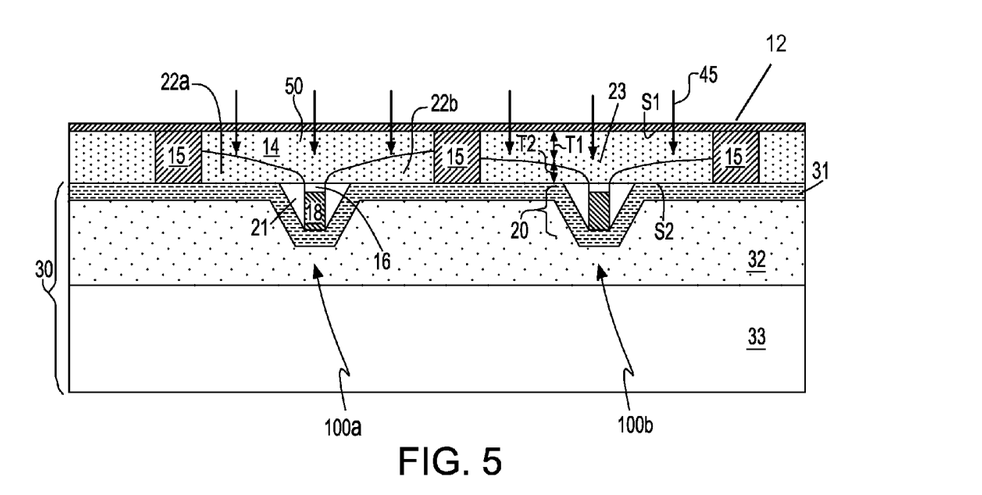
FIG. 5 is a side cross-sectional view depicting forming a retrograded well through the first surface of the semiconductor layer, in accordance with one embodiment of the present method.
Figure 6:
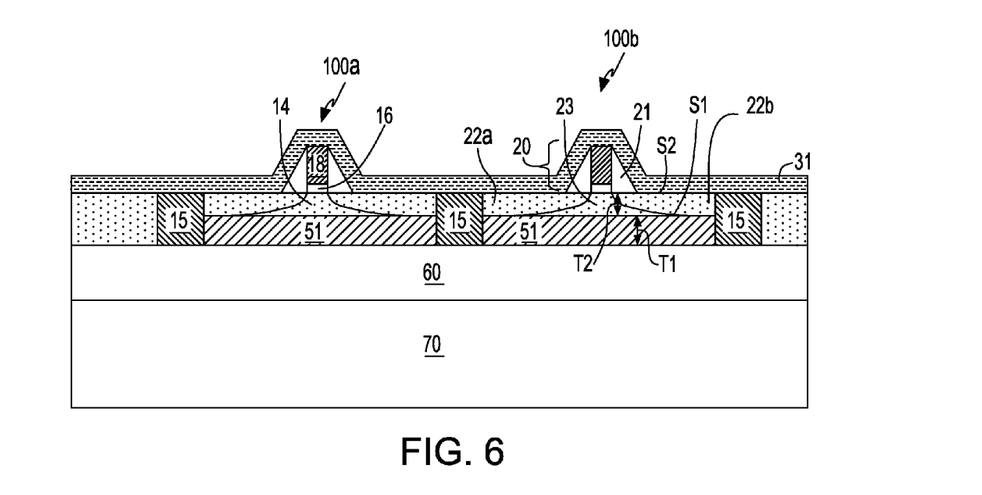
FIG. 6 is a side cross-sectional view depicting forming a buried dielectric layer on the first surface of the semiconductor layer, removing at least a portion of the handling structure, and activating the retrograded well, in accordance with one embodiment of the present method.

FIGS. 5 and 6 depict forming a retrograded well 50 through the first surface S1 of the semiconductor layer 14. The retrograded well 50 may also be referred to as a super steep retrograded well (SSRW). In one embodiment, the retrograded well 50 is formed by ion implanting dopants of an opposite conductivity as the source region 22a and the drain region 22b into the semiconductor layer 14 through the remaining portion of the dielectric layer 14 that is present on the first surface S1 of the semiconductor layer 14, or implanting through an exposed first surface S1 of the semiconductor layer 13 when the dielectric layer 12 has been removed in its entirety.

In one embodiment, forming of the retrograded well 50 through the first surface S1 of the semiconductor layer 14 comprises ion implantation of a dopant having an opposite conductivity as the source regions 22a and the drain regions 22b, wherein the dopant of the retrograded well 50 is present at a concentration greater than $1 \times 10^{16}$ atoms/cm$^3$ in first half thickness T1 of the semiconductor layer 14 present extending from the first surface S1 of the semiconductor layer, and a second half thickness T2 of the semiconductor layer 14 extending from the second surface S2 of the semiconductor layer 14 is substantially free of the dopant of the retrograded well 50. In one embodiment, in which the semiconductor layer 14 has a thickness ranging from 2 nm to 100 nm, the retrograded well 50 is present in a first half thickness T1 ranging from 1 nm to 50 nm. In another embodiment, in which the semiconductor layer 14 has a thickness ranging from 5 nm to 20 nm, the retrograded well 50 is present in a first half thickness T1 ranging from 2.5 nm to 10 nm. In one embodiment, the dopant concentration of the retrograded well 50 within the first thickness has a peak concentration ranging from $1 \times 10^{17}$ atoms/cm$^3$ to $1 \times 10^{20}$ atoms/cm$^3$. In another embodiment, the dopant concentration of the retrograded well 50 within the first thickness has a peak concentration ranging from $1 \times 10^{18}$ atoms/cm$^3$ to $1 \times 10^{19}$ atoms/cm$^3$. In yet another embodiment, the dopant concentration of the retrograded well 50 within the first thickness has a peak concentration ranging from $2 \times 10^{18}$ atoms/cm$^3$ to $7 \times 10^{18}$ atoms/cm$^3$.

To provide the retrograded well 50 in the first half thickness T1 of the semiconductor layer 14, the dopant type, ion implantation energy and concentration is selected to dictate that the dopant that provides the retrograded well 50 does not extend into the second half thickness T2 of the semiconductor layer 14. The dopant that provides the retrograded well 50 may be a p-type or n-type dopant. In one embodiment, the implant energy of the ion implantation process ranges from 0.2 keV to 30.0 keV. In another embodiment, the implant energy of the ion implantation process ranges from 1.0 keV to 25.0 keV. In yet another embodiment, the implant energy of the ion implantation process ranges from 1.0 keV to 5.0 keV. The dopant concentration of the ion implantation process ranges from $1 \times 10^{11}$ atoms/cm$^2$ to $1 \times 10^{15}$ atoms/cm$^2$. In another embodiment, the dopant concentration of the ion implantation process ranges from $1 \times 10^{12}$ atoms/cm$^2$ to $1 \times 10^{14}$ atoms/cm$^2$. In yet another embodiment, the dopant concentration of the ion implantation process ranges from $1 \times 10^{12}$ atoms/cm$^2$ to $1 \times 10^{13}$ atoms/cm$^2$.

In one embodiment, in which the first semiconductor device 100a and the second semiconductor device 100b are arranged in a complementary metal oxide semiconductor (CMOS) device, the dopant implants for the retrograded well 50 are performed using photolithography, ion implantation and photoresist (PR) stripping processes. Photolithography is used for selectively defining the areas correlating to the first semiconductor device 100a and second semiconductor device 100b for well implants. The ion implantation of dopant for the retrograded well 50 of a first semiconductor device 100a including an n-type field effect transistor involves a p-type implant species, such as B, $BF_2$, or In. The ion implantation of dopant for the retrograded well 50 of the second semiconductor device 100b including a p-type field effect transistor involves an n-type implant species, such as As, P, or Sb. In one embodiment, the range of implant energies for the ion implantation process to provide the retrograded well 50 ranges from 0.2 keV to 1 keV for B. In another embodiment, the range of implant energies for the ion implantation process to provide the retrograded well 50 ranges from 1.0 keV to 5 keV for $BF_2$. In yet another embodiment, the range of implant energies for the ion implantation process to provide the retrograded well 50 ranges from 5 keV to 30 keV for In. In an even further embodiment, the range of implant energies for the ion implantation process to provide the retrograded well 50 ranges from 5 keV to 25 keV for As, P, and Sb.

FIG. 6 is a side cross-sectional view depicting applying an anneal process to activate the retrograded well 50 (hereafter referred to as activated retrograded well 51). In one embodiment, the retrograded well is annealed using laser anneal or flash anneal. The laser anneal process may allow for raising the temperature of only specific regions of the device, such as the retrograded well, to provide the activated retrograded well 51. In some embodiments, the laser annealing increases the temperature of the retrograded well to greater than 900° C. for a time period of less than 1 second. In one embodiment, the temperature applied to the retrograded well to form the activated retrograded well 51 ranges from 1000° C. to 1400° C. In another embodiment, the temperature applied to the retrograded well to form the activated retrograded well 51 ranges from 1100° C. to 1350° C. In yet another embodiment, the temperature applied to the retrograded well to form the activated retrograded well 51 ranges from 1150° C. to 1250° C. The time period for the anneal process may be less than 100 milliseconds. In one embodiment, the time period for the anneal process may range from 2 milliseconds to 10 milliseconds. In another embodiment, the time period for the anneal process may range from 2 milliseconds to 5 milliseconds. It is noted that other temperatures and time periods have been contemplated for activating the dopant of the retrograded well to provide the activated retrograded well 51.

In one embodiment, the introduction of the dopant of the retrograded well through the backside surface, i.e., first surface S1, of the semiconductor device 100a, 100b, and the activating of the retrograded well after the thermal processing that activates the dopants of the source regions 22a and drain regions 22b reduces the thermal budget that is subjected to the retrograded well.

FIG. 6 further depicts one embodiment of forming a buried dielectric layer 60 on the first surface S1 of the semiconductor layer 14, and removing at least a portion of the handling structure 30. The buried dielectric layer 60 may be deposited to be position on the first surface S1 of the semiconductor layer 14 or in direct contact with a remaining portion of the dielectric layer 12 that is present on the first surface S1 of the semiconductor layer 14. Suitable dielectric materials for the buried dielectric layer 60 include oxide, nitrides or oxynitride materials. The buried dielectric layer 60 typically has a thickness ranging from 5 nm to 50 nm, typically ranging from 10 nm to 20 nm. The buried dielectric layer 60 may be formed using thermal growth or deposition processes. For example, in the embodiments in which the buried dielectric layer 60 is deposited, the buried dielectric layer 60 may be deposited using chemical vapor deposition (CVD). In the embodiments in which the buried dielectric layer 60 is grown, the buried dielectric layer 60 may be formed using thermal growth process, such as thermal oxidation. In some embodiments, a base substrate 70 is formed on the buried dielectric layer 60. The base substrate 70 may be composed of a semiconductor layer, such as a silicon-containing layer.

In one embodiment, removing at least a portion of the handling structure 30 includes removing the handling wafer 33 and the handling semiconductor material 32 stopping on the conformal dielectric layer 31. The handling wafer 33 and the handling semiconductor material 32 may be removed using a selective etch process. For example, in a first selective etch step handling wafer 33 may be etched selective to the handling semiconductor material 32. Thereafter, the handling semiconductor material 32 is etched selective to the conformal dielectric layer 31. In some embodiments, removing the handling structure may further include a planarization process.

FIG. 6 depicts one embodiment of a semiconductor device having a semiconductor layer 14 overlying a dielectric layer, i.e. buried dielectric layer 60, in which a gate structure 20 is present on the semiconductor layer 14. Source regions 22a and drain regions 22b are typically present within the semiconductor layer 14 adjacent to a portion of the semiconductor layer 14 that the gate structure 20 is in contact with. A retrograded well, i.e., activated retrograded well 51, may be present between the source regions 22a and the drain region 22b, and extending from the dielectric layer, i.e., buried dielectric layer 60, wherein the activated retrograded well 51 includes dopant of opposite conductivity than the source regions 22a and the drain regions 22b. The dopant concentration of the activated retrograded well 51 may be greater than $1 \times 10^{16}$ atoms/cm³. In one embodiment, the dopant concentration of the activated retrograded well 51 ranges from $1 \times 10^{17}$ atoms/cm³ to $1 \times 10^{20}$ atoms/cm³. A region substantially free of the dopant of the retrograded well over the retrograded well and between the source regions and drain regions. By substantially free of the dopant of the retrograded well it is meant that the region comprises a concentration of less than $1 \times 10^3$ atoms/cm³ of the dopant of the retrograded well. In one embodiment, the region that is substantially free of the dopant of the retrograded well comprises no dopant of the retrograded well.

While the invention has been particularly shown and described with respect to preferred embodiments thereof, it will be understood by those skilled in the art that the foregoing and other changes in form and details may be made therein without departing from the spirit and scope of the present invention.

What is claimed is:

1. A semiconductor device comprising:
   a semiconductor layer overlying a dielectric layer;
   a gate structure present on the semiconductor layer;
   source regions and drain regions present within the semiconductor layer adjacent to a portion of the semiconductor layer that the gate structure is in contact with;
   a retrograded well between the source regions and the drain region and extending from the dielectric layer, wherein the retrograded well includes dopant of opposite conductivity than the source and drain regions, and in a concentration of greater than $1 \times 10^{16}$ atoms/cm³; and
   a region substantially free of the dopant implanted to form the retrograded well, wherein the region substantially free of the dopant is present over the retrograded well and between the source regions and drain regions.

2. The semiconductor device of claim 1, wherein the retrograded well is present in a lower ½ thickness of the semiconductor layer.

3. The semiconductor device of claim 2, wherein a peak dopant concentration in the retrograded well ranges from $1 \times 10^{17}$ atoms/cm$^3$ to $1 \times 10^{20}$ atoms/cm$^3$.

4. The semiconductor device of claim 1, wherein the retrograded well has a thickness ranging from 1 nm to 50 nm.

5. The semiconductor device of claim 1, wherein the semiconductor layer comprises Si, SiGe, SiGeC, SiC, Ge, Ge alloys, GaAs, InAs, InP and combinations thereof.

6. The semiconductor device of claim 1, wherein the semiconductor device is a field effect transistor (FET).

7. The semiconductor device of claim 1, wherein the gate structure includes at least one gate conductor and at least one gate dielectric, wherein the gate dielectric is in contact with the semiconductor layer.

8. The semiconductor device of claim 1, wherein the dielectric layer has a thickness that ranges from 1 nm to 20 nm.

9. The semiconductor device of claim 1, wherein the source regions and the drain regions are doped to a p-type or n-type conductivity.

10. The semiconductor device of claim 1, wherein the region substantially free of the dopant of the retrograded well comprises no dopant of the retrograded well.

11. The semiconductor device of claim 1, wherein a dopant concentration of the region that is substantially free of the dopant has a dopant concentration less than $1 \times 10^3$ atoms/cm$^3$.

12. A complementary metal oxide semiconductor (CMOS) device comprising:
a substrate;
a first conductivity semiconductor device present in a first portion of the substrate comprising:
a first semiconductor layer overlying a first dielectric layer,
a first gate structure present on the first semiconductor layer,
source regions and drain regions of a first conductivity present within the first semiconductor layer adjacent to a portion of the first semiconductor layer that the first gate structure is in contact with,
a first retrograded well of a second conductivity between the source regions and the drain regions of the first conductivity and extending from the first dielectric layer, and
a first region substantially free of the dopant implanted to form the first retrograded well wherein the first region substantially free of the dopant is present over the first retrograded well and between the source regions and drain regions of the first conductivity; and
a second conductivity semiconductor device present in a second portion of the substrate comprising:
a second semiconductor layer overlying a second dielectric layer,
a second gate structure present on the second semiconductor layer,
source regions and drain regions of a second conductivity present within the second semiconductor layer adjacent to a portion of the second semiconductor layer that the second gate structure is in contact with,
a second retrograded well of a first conductivity between the source regions and the drain regions of the second conductivity and extending from the second dielectric layer, and
a second region substantially free of the dopant implanted to form the second retrograded well, wherein the second region substantially free of the dopant is present over the second retrograded well and between the source regions and drain regions of the second conductivity.

13. The CMOS device of claim 12, wherein at least one of the first retrograded well and the second retrograded well is present in a lower V2 thickness of one of the first and second semiconductor layer.

14. The CMOS device of claim 12, wherein a peak dopant concentration in at least one of the first retrograded well and the second retrograded well ranges from $1 \times 10^{17}$ atoms/cm$^3$ to $1 \times 10^{20}$ atoms/cm$^3$.

15. The CMOS device of claim 12, wherein at least one of the first retrograded well and the second retrograded well has a thickness that ranges from 1 nm to 50 nm.

16. The CMOS device of claim 12, wherein at least one of the first and second semiconductor layers comprises Si, SiGe, SiGeC, SiC, Ge, Ge alloys, GaAs, InAs, InP and combinations thereof.

17. The CMOS device of claim 12, wherein the first conductivity semiconductor device and the second conductivity semiconductor device are field effect transistors (FETs).

18. The CMOS device of claim 12, wherein at least one of the first gate structure and the second gate structure includes at least one gate conductor and at least one gate dielectric.

19. The CMOS device of claim 12, wherein at least one of the first dielectric layer and the second dielectric layer has a thickness that ranges from 1 nm to 20 nm.

20. The CMOS device of claim 12, wherein the region substantially free of the dopant of the first retrograded well comprises no dopant of the first retrograded well.

21. The CMOS device of claim 12, wherein the region substantially free of the dopant of the second retrograded well comprises no dopant of the second retrograded well.

22. The semiconductor device of claim 12, wherein the dopant concentration of the first region that is substantially free of the dopant has a dopant concentration less than $1 \times 10^3$ atoms/cm$^3$, and the dopant concentration of the second region that is substantially free of the dopant has a dopant concentration less than $1 \times 10^3$ atoms/cm$^3$.

* * * * *